(12) United States Patent
Anthony et al.

(10) Patent No.: US 6,865,107 B2
(45) Date of Patent: Mar. 8, 2005

(54) MAGNETIC MEMORY DEVICE (75) Inventors: Thomas C. Anthony, Sunnyvale, CA (US); Frederick A. Perner, Palo Alto, CA (US); Manoj K. Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/601,895

(22) Filed: Jun. 23, 2003

(65) Prior Publication Data

US 2004/0257870 A1 Dec. 23, 2004

(51) Int. Cl.⁷ .............................................. G11C 11/14
(52) U.S. Cl. ...................... 365/171; 365/172; 365/173
(58) Field of Search .................... 365/158, 171, 365/173, 189.01, 230.06, 55, 66, 213, 172

(56) References Cited

U.S. PATENT DOCUMENTS

| | | | |
|---|---|---|---|
| 5,039,655 A | 8/1991 | Pisharody | |
| 5,956,267 A | 9/1999 | Hurst et al. | |
| 6,108,177 A * | 8/2000 | Gill | 360/324.12 |
| 6,153,443 A | 11/2000 | Durlam et al. | |
| 6,165,803 A | 12/2000 | Chen et al. | |
| 6,211,559 B1 * | 4/2001 | Zhu et al. | 257/421 |
| 6,261,893 B1 | 7/2001 | Chang et al. | |
| 6,429,044 B1 | 8/2002 | Tuttle | |
| 6,504,221 B1 * | 1/2003 | Tran et al. | 257/421 |
| 6,525,957 B1 * | 2/2003 | Goronkin et al. | 365/158 |
| 6,556,473 B2 * | 4/2003 | Saito et al. | 365/158 |
| 6,590,803 B2 * | 7/2003 | Saito et al. | 365/158 |
| 2004/0076036 A1 * | 4/2004 | Heide | 365/173 |
| 2004/0105303 A1 * | 6/2004 | Fukuzumi | 365/158 |

* cited by examiner

Primary Examiner—Richard Elms
Assistant Examiner—Dang T Nguyen (57) ABSTRACT

A magnetic memory array is described having a plurality of bit cells. Each bit cell includes at least one magnetic layer having free magnetic poles with a corresponding demagnetization field. A magnetic flux absorbing layer is disposed between at least two of the plurality of bit cells.

22 Claims, 8 Drawing Sheets

MAGNETIC MEMORY DEVICE

THE FIELD OF THE INVENTION

The present invention generally relates to magnetic random access memory (MRAM) devices, and more particularly to magnetic memory arrays.

BACKGROUND OF THE INVENTION

A magnetic random access memory (MRAM) wafer is generally a silicon wafer onto which is built, or disposed, a group of magnetic memory chips (also known as dies). A typical MRAM wafer might have more than 10000 magnetic memory chips. The magnetic memory chips, or memory chips, are disposed across the MRAM wafer in a grid pattern prior to separation from the MRAM wafer for subsequent use in electronic devices.

Each memory chip is comprised of one or more memory arrays, with each memory array comprised of a plurality of bit cells (also referred to as "memory cells"). The bit cells of a memory array store retrievable data. The data in each bit cell is stored as an orientation of magnetization in the magnetic layers of the bit cell. For example, in one type of bit cell known as a magnetic tunnel junction, the bit cell consists of two magnetic layers separated by a thin insulating tunnel barrier. The logic value of the bit cell is determined by the relative orientations of the magnetizations of the two layers. If the orientations of magnetization of the layers point in the same direction (referred to as a "parallel" orientation), the resistance of the bit cell is low, and a logic value 0 is assigned. If the orientations of magnetization of the layers point in opposite directions (referred to as an "anti-parallel" orientation), the resistance of the bit cell is high and a logic value 1 is assigned. Typically, the orientation of magnetization of one layer is fixed or pinned (the "reference layer"), whereas the orientation of magnetization of the other layer can be varied by an applied magnetic field (the "data layer" or "sense layer").

Conductive traces, referred to as word lines and bit lines, are routed across the bit cells that form the memory arrays. Word lines extend along rows of the bit cells and bit lines extend along columns of the bit cells. Selected word lines and bit lines are energized with electric currents in combination to create magnetic fields that switch the orientation of magnetization of a selected bit cell from parallel to anti-parallel, or vise versa. The word lines and bit lines may be collectively referred to as write lines. The write lines can also be employed to read the logic value stored in the bit cell. Alternatively, separate sense lines can be added for purposes of reading stored data from the bit cells.

The magnetization stored in a bit cell creates magnetic field lines analogous to those associated with magnets generally, and as such, the magnetization has positive magnetic poles and negative magnetic poles, or charges, which serve as source and sink for the field lines. The closer the positive magnetic poles are to the negative magnetic poles, the stronger the magnetic field created by those poles.

High-density memory is characterized by the tight packing of small bit cells within memory arrays. Small bit cells have magnetic poles that are inherently close together and that produce strong magnetic fields. Additionally, the magnetic field associated with positive and negative poles within the bit cell is referred to as a demagnetization field, since it opposes the magnetization direction within the bit cell. Demagnetization fields become stronger as the magnetic poles that give rise to them are brought closer together.

To maintain the desired magnetization orientation in the data layer (0 and 1 state), sufficient magnetic anisotropy must be present in the magnetic film to overcome the demagnetization field. Two predominant magnetic anisotropy terms are shape anisotropy and magnetocrystalline anisotropy, with shape anisotropy being predominant for sub-micrometer bit cells. Reduction of the demagnetization field along the easy axis of the bit cells would enhance the stability of the bit cells. More stable magnetic bit cells are clearly desirable.

Coercivity is a measure of a material's resistance to magnetization reversal by an applied magnetic field. In an unpatterned film of soft, ferromagnetic material, the coercivity is typically determined by the resistance to domain wall motion. Such coercivity can be substantially lower than the magnetic anisotropy of the film. However, thin magnetic films patterned to sub-micrometer dimensions often do not contain domain walls. Coercivities in such patterned films are generally comparable to the total magnetic anisotropy of the bit cell, which is dominated by shape anisotropy. For bit cells with an aspect ratio greater than two, shape anisotropy, and hence coercivity, is inversely proportional to the width of the bit cell. As MRAM bit cells shrink in size to accommodate higher bit cell densities, the coercivity climbs, and with it the amount of electric current needed to write the bit cells.

For small magnetic particles the magnetization switching mechanism is often governed by magnetization rotation rather than domain wall motion. As the magnetization rotates through the hard axis (short dimension) of the bit cell, the demagnetization field reaches a maximum value. In order to switch the magnetization orientation, the applied magnetic field must overcome the hard axis demagnetization field. Reduction of this demagnetization field would lower the coercivity of the bit cell, and hence, the current necessary to write the bit cell. Lower write currents in MRAM devices are desirable.

High-density memory, which is useful for advanced computing applications, is associated with closely packed, small bit cells. Demagnetization fields in small bit cells cause instability of the easy axis magnetization orientation and high switching fields.

SUMMARY OF THE INVENTION

A magnetic memory array includes a plurality of bit cells. Each bit cell includes at least one magnetic layer having free magnetic poles with a corresponding demagnetization field. A magnetic flux absorbing layer is disposed between at least two of the plurality of bit cells.

BRIEF DESCRIPTION OF THE DRAWINGS

Exemplary embodiments of the invention are better understood with reference to the following drawings. The elements of the drawings are not necessarily to scale relative to each other. Like reference numerals designate corresponding similar parts.

DETAILED DESCRIPTION

Figure 1:
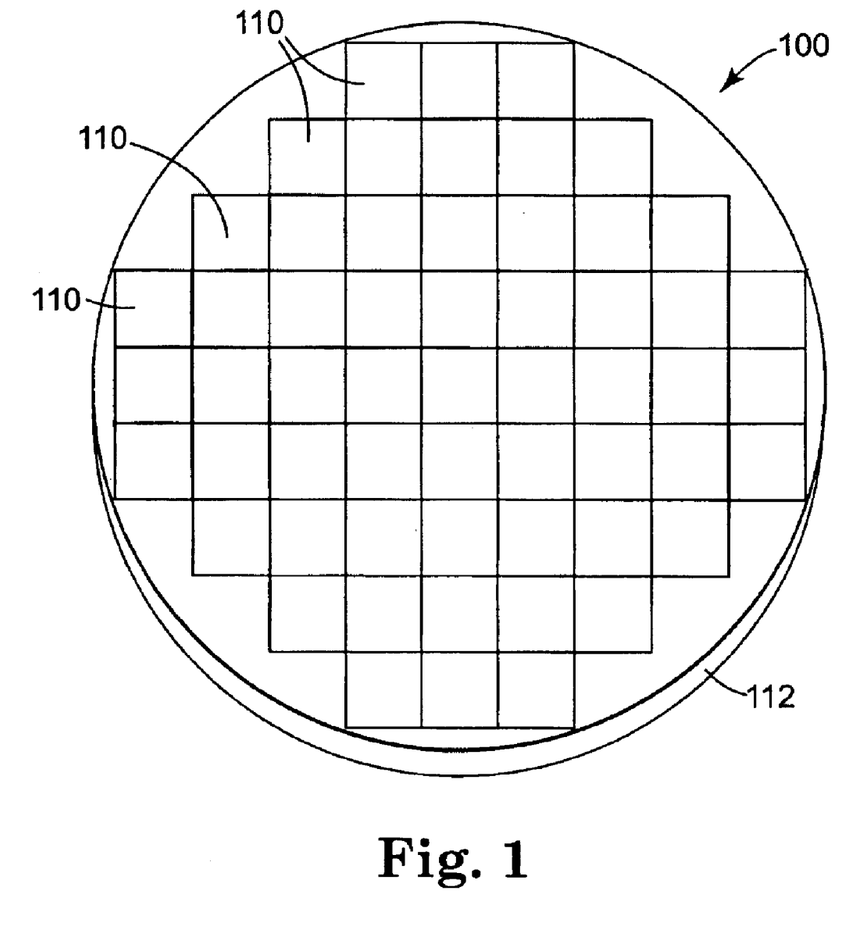
FIG. 1 is a perspective view of a simplified memory wafer.

A perspective view of a simplified magnetic random access memory (MRAM) wafer is presented in FIG. 1. MRAM wafer 100 includes a plurality of separable memory chips 110 disposed upon silicon wafer 112. Each of the separable memory chips 110 includes at least one memory array having multiple bit cells (not shown).

Figure 2:
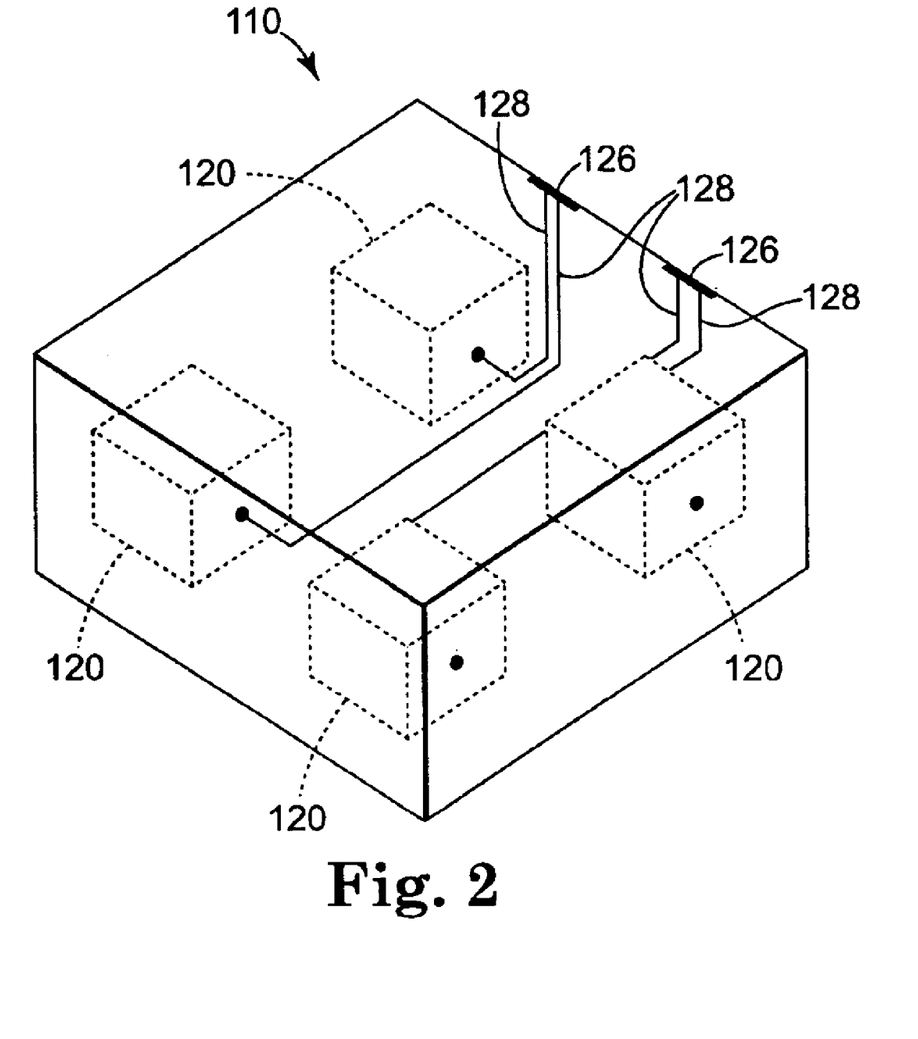
FIG. 2 is a perspective view of a simplified magnetic memory chip illustrating communication lines connected to multiple memory arrays.
Figure 3:
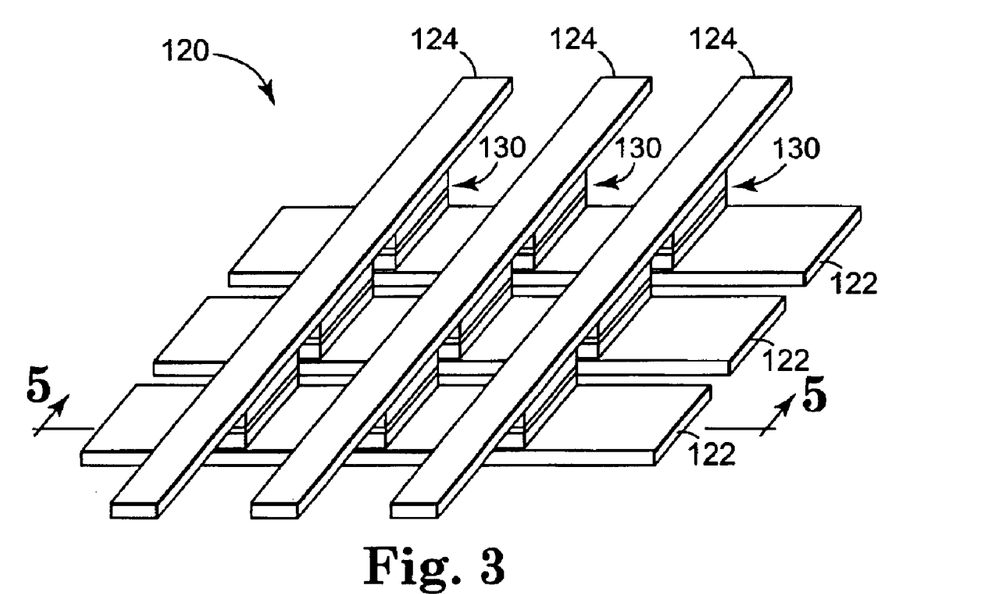
FIG. 3 is a perspective view of a simplified magnetic memory array showing a plurality of bit cells.

FIG. 2 illustrates a simplified magnetic memory chip 110 after separation from memory wafer 100. Memory chip 110 has at least one and typically a plurality of magnetic memory arrays 120. As illustrated in FIG. 3, each magnetic memory array 120 includes intersecting word lines 122 and bit lines 124, and at each intersection of a word line 122 and a bit line 124 is a magnetic memory cell, or bit cell 130. Each magnetic memory chip 110 has at least one bond pad 126. Bond pads 126 provide a location for peripheral electronic devices to electrically access the memory arrays 120 (and their associated magnetic bit cells 130) via communication lines 128 within the magnetic memory chip 110.

FIG. 3 is a perspective view of a single simplified magnetic memory array 120, illustrating the relationship between word lines 122, bit lines 124 and bit cells 130. Word lines 122 are positioned on a first side of bit cells 130 while bit lines 124 are positioned on a second side of bit cells 130 opposite word lines 122. Typically, word lines 122 and bit lines 124 are oriented orthogonally relative to each other (collectively, word lines 122 and bit lines 124 may be referred to as write lines). It should be understood that FIG. 3 represents only one possible embodiment of a magnetic memory array 120. In alternative embodiments, memory array 120 may contain additional conductor lines for sensing the state of magnetic bit cells 130. In addition, magnetic memory arrays 120 may comprise multiple layers of magnetic bit cells 130.

Figure 4:
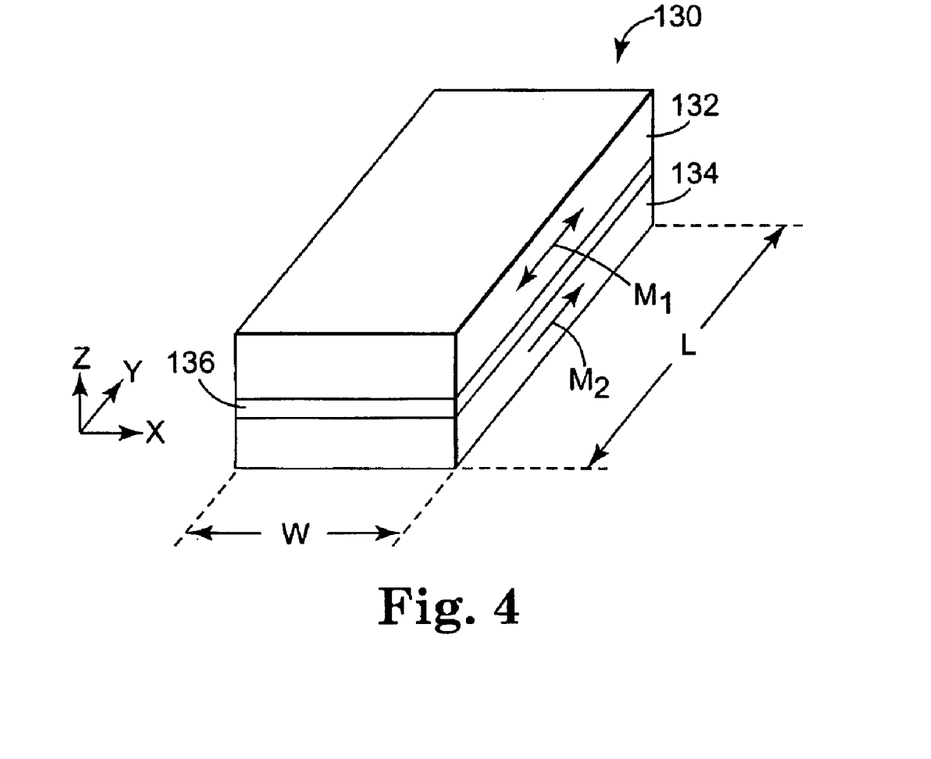
FIG. 4 illustrates a bit cell.

Data is stored as an orientation of magnetization in the magnetic layers of bit cell 130. As illustrated in FIG. 4, bit cell 130 includes an active magnetic data film 132 (sense layer) and a pinned magnetic film 134 (reference layer), which are separated by a dielectric region 136 (tunnel barrier). The orientation of magnetization in sense layer 132 is not fixed and can assume either of two stable orientations as shown by arrow M1 (i.e. sense layer 132 has free magnetic Doles). In contrast, pinned reference layer 134 has a fixed orientation of magnetization, as shown by arrow M2. Sense layer 132 rotates its orientation of magnetization in response to electrical currents applied to write lines 122 and 124 during a write operation directed to selected bit cells 130.

As noted above, the orientation of magnetization in sense layer 132 creates an opposing demagnetization field. The opposing demagnetization field will have positive magnetic poles and negative magnetic poles. Demagnetization fields become stronger as the magnetic poles are brought closer together. Additionally, small bit cells 130 generally have a width W of 500 nanometers or less. High-density memory encourages the tight packing of bit cells 130 within memory arrays 120, and therefore, bit cells 130 generally considered suitable for use in high-density memory arrays have at least one dimension that is less than 500 $\mu$nm. As a result, small bit cells 130 have magnetic poles that are inherently close together and exhibit strong demagnetization fields.

As shown in FIG. 4, bit cells 130 can have a length L that is greater than the width W of bit cell 130. The ratio between the length L and the width W of bit cells 130 is defined as the aspect ratio. For example, bit cells 130 having an aspect ratio of two indicates the length L is twice the width W, i.e. L=2 W. In the case where bit cell 130 is a magnetic bit cell with aspect ratio greater than one, the magnetization prefers to lie along the long axis of the bit cell (the easy axis), i.e. length L, so as to reduce the magnitude of the demagnetization field and its corresponding magnetostatic energy.

For small magnetic particles the magnetization switching mechanism is often governed by magnetization rotation rather than domain wall motion. As the magnetization rotates through the hard axis (short dimension) of the bit cell 130, the demagnetization field reaches a maximum value. To switch the magnetization orientation, the applied field must overcome this hard axis demagnetization field. Reduction of this demagnetization field lowers the coercivity of the bit cell 130, and hence, the current necessary to write to the bit cell 130. Lower write current in MRAM devices is desirable because less power is consumed in storing data.

To ensure a stable magnetization orientation in the sense layer 132 (the 0 and 1 state), sufficient magnetic anisotropy must be present in the magnetic film to overcome the demagnetization field and maintain the magnetization in the desired state. Reduction of the demagnetization field along the easy axis of bit cells 130 enhances the stability of the bit cells 130. Bit cells 130 that are more stable can be packed more closely together, which is desirable in high density memory.

Deposition of a magnetically permeable material in the vicinity of bit cell 130 reduces the demagnetization field acting on the sense layer by the creation of magnetic image charges, or poles, in the permeable material. These image charges offset the charges associated with the magnetization of the sense layer 132. The net reduction in magnetic charge in the vicinity of the sense layer 132 yields a reduced demagnetization field.

Switching the magnetic orientation of the sense layer 132 by magnetization rotation requires an applied field proportional to the hard axis demagnetization field. Reduction of the demagnetization field due to the proximity of a magnetically permeable material leads to bit cells 130 having reduced coercivity. Therefore, the effects of demagnetization fields are reduced by the presence of a magnetically permeable medium on or near bit cell 130, or between at least two bit cells 130. The result is a memory array 120 that utilizes less power and permits smaller write current drivers, thereby reducing the area of the memory chip. Therefore, the present invention enables lower power, higher capacity, less expensive memory arrays 120.

Figure 5:
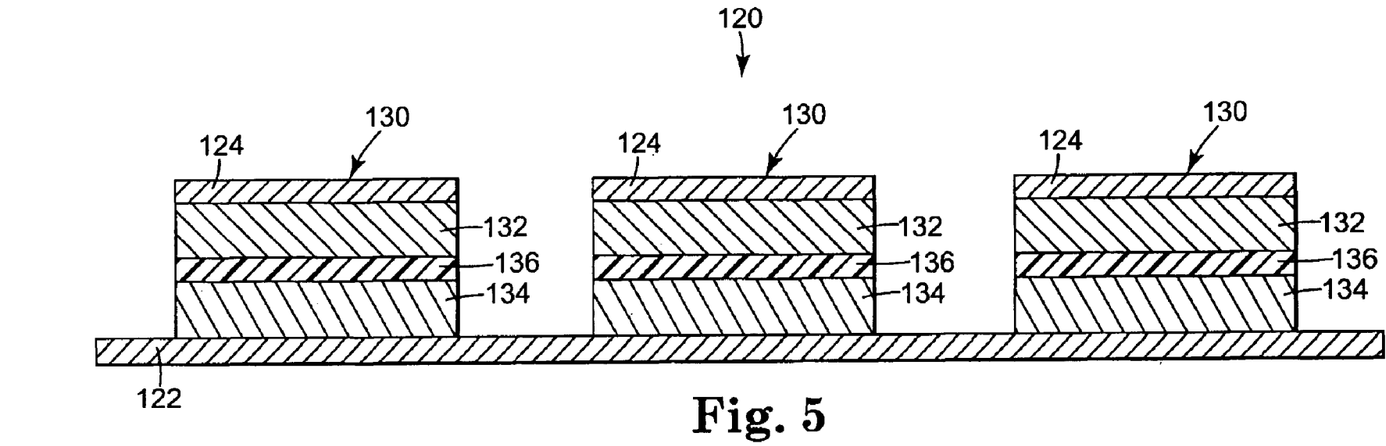
FIG. 5 is a cross sectional view of the memory array of FIG. 3 taken along line 5—5.

Memory array 120 comprises patterned bit cells 130. In the following illustrations, an array of bit cells 130 is patterned in rows and columns. However, the present invention is beneficially employed with any array of bit cells 130, and is not limited to orthogonal arrays of rows and columns of bit cells 130. Bit cells 130 are formed at each intersection of a word line 122 and a bit line 124. FIG. 5 illustrates a cross-section of memory array 120 where bit cells 130 are aligned in columns on top of word lines 122. Electrical currents sent along word lines 122 and write lines 124 create magnetic fields that combine to switch the orientation of magnetization (and thus the logic state) of the magnetic sense layer 132 of a selected bit cell 130.

In one embodiment according to the invention, the demagnetization field lines of flux are reduced within bit cells 130 by depositing a magnetically permeable material adjacent to bit cells 130. Because bit cells 130 in the exemplary memory array 120 are aligned in rows and columns, one embodiment according to the invention includes placing magnetically permeable material along the columns of bit cells 130, thus providing a pathway for the demagnetization fields' lines of flux. Upon reading and appreciating this disclosure, those skilled in the art of MRAM devices will recognize that magnetically permeable, flux absorbing material also can be placed along rows of bit cells 130, or along both columns and rows of bit cells 130, or more generally, between any two bit cells 130 to reduce the effects of the demagnetization fields on bit cells 130.

Figure 6:
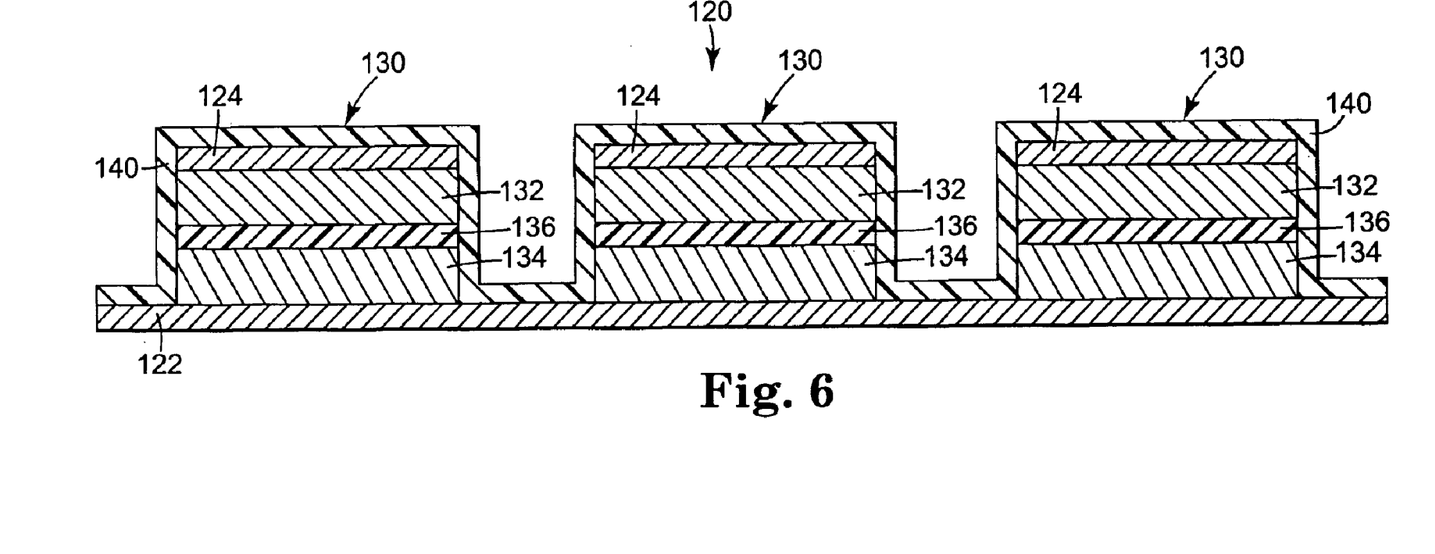
FIG. 6 is the cross sectional view of FIG. 5 illustrating columns of bit cells having a conformal coating of a non-magnetic material according to one embodiment of the present invention.

One method of constructing a memory array with electrically conductive, magnetically permeable material between bit cells 130 is described herein with reference to FIGS. 5–8. When the magnetically permeable material is electrically conductive, the magnetically permeable material placed near bit cells 130 should be electrically isolated from bit cells 130. FIG. 5 illustrates a cross-sectional view of memory array 120 where columns of bit cells 130 are disposed on word line 122. As shown in FIG. 6, an electrically non-conductive, non-magnetic layer 140, i.e., a dielectric material, is disposed over each bit cell 130 and write lines 122 and 124 to electrically isolate bit cells 130 from subsequent electrically conductive layers. In one embodiment according to the invention, the layer 140 is a conformal coating that substantially uniformly coats bit cells 130 and write lines 122 and 124.

Figure 7:
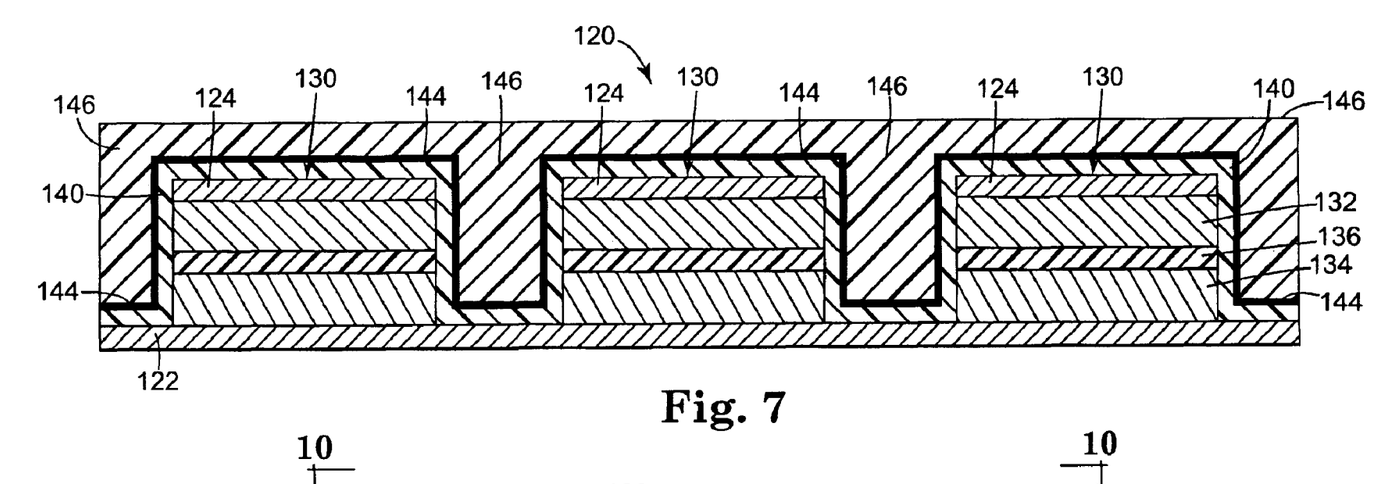
FIG. 7 illustrates the columns of bit cells of FIG. 6 with a magnetic flux absorbing layer and a thick non-magnetic material deposited.

With the columns of bit cells 130 from FIG. 6 electrically insulated by first dielectric layer 140, FIG. 7 illustrates subsequent processing steps where at least one magnetically permeable, i.e. magnetic flux absorbing, layer is added to memory array 120. As shown in FIG. 7, a magnetic flux absorbing layer 144 is subsequently deposited over first non-conductive, non-magnetic dielectric layer 140 and columns of bit cells 130. Finally, a second layer 146 of non-conductive, non-magnetic dielectric material is coated over magnetic flux absorbing layer 144 and columns of bit cells 130 on memory array 120. Second dielectric layer 146 is deposited to be of sufficient thickness to fill the troughs between adjacent columns of bit cells 130. FIG. 7 thus illustrates a magnetic flux absorbing layer 144 deposited along columns of bit cells 130 to reduce the effects of demagnetization fields on bit cells 130 in one embodiment according to the present invention.

Figure 8:
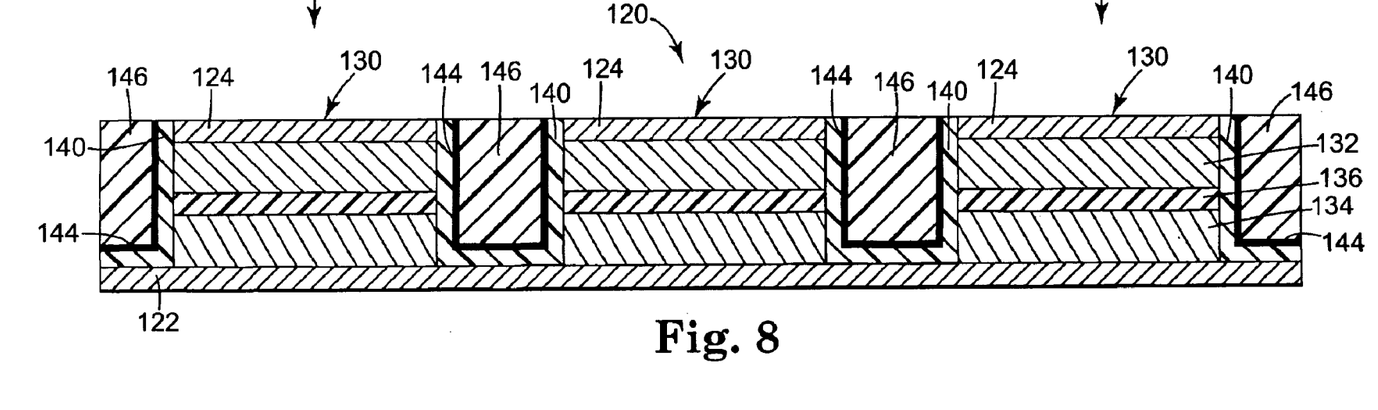
FIG. 8 is the cross sectional view of FIG. 7 showing the magnetic flux absorbing layer and the two non-magnetic layers removed to expose the bit lines of the memory array.

Write lines 124 can be electrically exposed by removing magnetic flux absorbing layer 144 from write lines 124. As illustrated in FIG. 8, dielectric layers 140 and 146 and magnetic flux absorbing layer 144 have been removed from write lines 124. One suitable method for removing dielectric layers 140 and 146 and magnetic flux absorbing layer 144 is to chemical-mechanically polish layers 140, 146, and 144 from write line 124. The chemical-mechanical polishing process planarizes memory array 120 as shown in FIG. 8. Upon reading and appreciating this disclosure, those skilled in the art will recognize other suitable methods for exposing write line 124 of each bit cell 130. In this embodiment according to the invention, columns of bit cells 130 having a magnetic flux absorbing layer 144 adjacent to bit cells 130 reduce the demagnetization fields of the bit cells 130.

Figure 9:
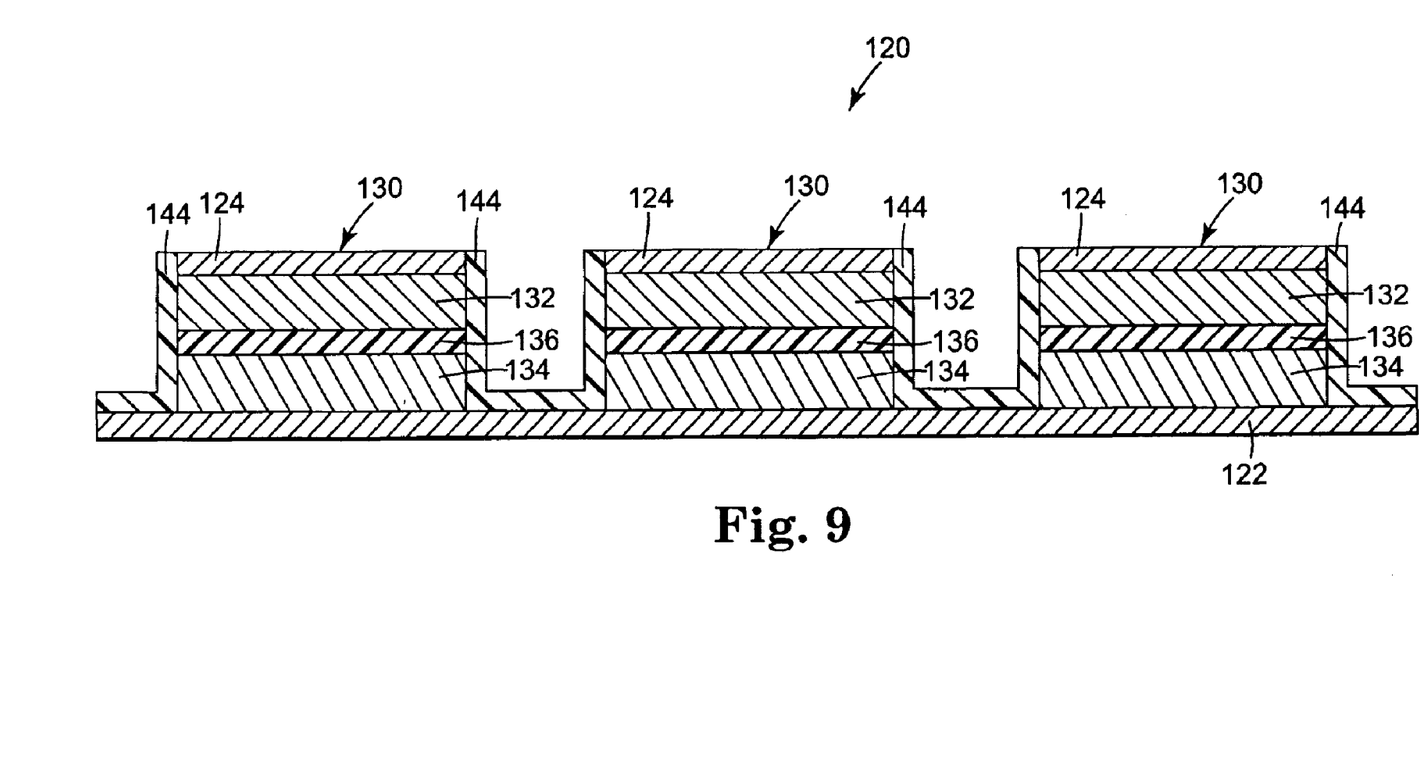
FIG. 9 is a cross-sectional view of columns of bit cells in a memory array having one layer of magnetic flux absorbing material deposited along the columns of bit cells according to another embodiment of the present invention.

In another embodiment according to the present invention, magnetic flux absorbing layer 144 is an electrically insulating, i.e. electrically non-conducting, soft magnetic layer 144 deposited directly onto bit cells 130, as shown in FIG. 9. Deposition of electrically insulating, soft magnetic flux absorbing layer 144 obviates the need for non-conductive, non-magnetic dielectric layers 140 and 146. Ferrites are an example of an electrically insulating, soft magnetic material that could be used as permeable layer 144. An example of one acceptable electrically insulating, soft magnetic ferrite is $Fe_3O_4$. FIG. 9 illustrates that electrically insulating magnetic flux absorbing layer 144 has been deposited onto bit cells 130 with a subsequent removal of a portion of layer 144 such that write lines 124 are exposed.

In yet another embodiment according to the present invention, the electrically insulating, soft magnetic flux absorbing layer 144 of FIG. 9 can be deposited such that flux absorbing layer 144 fills the troughs between the bit cells 130. In this case, electrically insulating, soft magnetic flux absorbing layer 144 is substantially coplanar with the array 120 of bit cells 130.

The preceding examples set forth only a limited number of many possible constructions where the magnetic flux absorbing layer 144 is deposited between at least two bit cells 130 to reduce the demagnetization fields of the bit cells 130. Upon reading and appreciating this disclosure, it will be recognized that many combinations of dielectric, flux absorbing, and electrically insulating flux absorbing layers can be assembled and positioned between bit cells to achieve a reduction in the demagnetization fields of bit cells. As taught herein, magnetic flux absorbing layer 144 could be deposited along rows of bit cells 130, or along columns of bit cells 130, or along both rows and columns of bit cells 130 to reduce the demagnetization fields of the bit cells 130. Further, according to the invention magnetic flux absorbing layer 144 can be deposited such that bit cells 130 are completely surrounded by layer 144 prior to positioning write line 124.

Magnetically permeable layer 144 is a flux absorber. Magnetic flux lines, like electrical currents, always follow the path of least resistance. Thus, flux lines will follow the path of greatest permeance (lowest reluctance). In this way, magnetic flux lines associated with magnetization of bit cells 130 are directed away from the bit cells by magnetically permeable layer 144. Thus, the magnitude of the demagnetization field interfering with the magnetization state of bit cells 130 is reduced.

In one embodiment according to the invention, magnetic flux absorbing layer 144 has low coercivity and high permeability. For example, in one embodiment, the coercivity of magnetic flux absorbing layer 144 is about one Oersted. A preferred magnetic flux absorbing layer 144 has a coercivity of less than 10 Oersteds, more preferably less than 5 Oersteds, and still more preferably less than 2 Oersteds.

In one embodiment according to the invention, magnetic flux absorbing layer 144 has a magnetic permeability of about 1000. Magnetic permeability is a constant of proportionality between magnetic induction and magnetic field intensity. Materials having high magnetic permeability concentrate magnetic flux. A preferred magnetic flux absorbing layer 144 concentrates magnetic flux by a factor of more than 10, more preferably by a factor of more than 100, still more preferable by a factor of more than 1000.

In one embodiment according to the invention, magnetic flux absorbing layer 144 is a soft magnetic material. Magnetic flux absorbing layer 144 may be formed of, for example, iron, nickel, or cobalt, or alloys of iron, alloys of nickel, and alloys of cobalt. Specifically, it is beneficial to form magnetic flux absorbing layer 144 from amorphous cobalt-based alloys that have high magnetic permeability. Additionally, amorphizing agents, such as silicon, boron, hafnium, tantalum, tungsten, and zirconium can be added to cobalt, and cobalt-based alloys, to increase the amorphous portion of the metal structure.

Soft magnetic materials are those that exhibit reorientation of magnetization when subjected to a small magnetic field, such as the demagnetization field created in magnetic layers 132 and 134 of bit cells 130. Because the orientation of the demagnetization field varies throughout the writing process, in one embodiment according to the present invention magnetic flux absorbing layers 144 have an isotropic response to magnetic fields. Isotropic magnetic flux absorbing layers respond uniformly to magnetic fields irrespective of the orientation of the field. Some materials can be deposited as isotropic layers, such as some amorphous alloys of nickel, iron and/or cobalt. Preferred magnetic flux absorbing layers 144 will be formed from materials that are isotropic, and many of the magnetic flux absorbing layers 144 can be made isotropic through suitable processing techniques.

Magnetic flux absorbing layers 144 can be made isotropic by, for example, either by depositing them in the presence of a rotating magnetic field, or alternately, by rotating the memory wafer containing memory arrays 120 in the presence of a static magnetic field as magnetic flux absorbing layers 144 are deposited. Additionally, magnetic flux absorbing layers 144 can be made isotropic by annealing the memory wafer containing memory arrays 120 in an oven after magnetic flux absorbing layers 144 have been deposited. However, annealing memory arrays 120 at high temperatures can negatively affect the magnetic layers 132 and 134, and for this reason, annealing at high temperatures, i.e., temperatures sufficient to alter magnetic properties, is less preferred. In one preferred embodiment, a rotating magnetic field is employed in the annealing process to isotropically orient the structure of magnetic flux absorbing layer 144.

Figure 10:
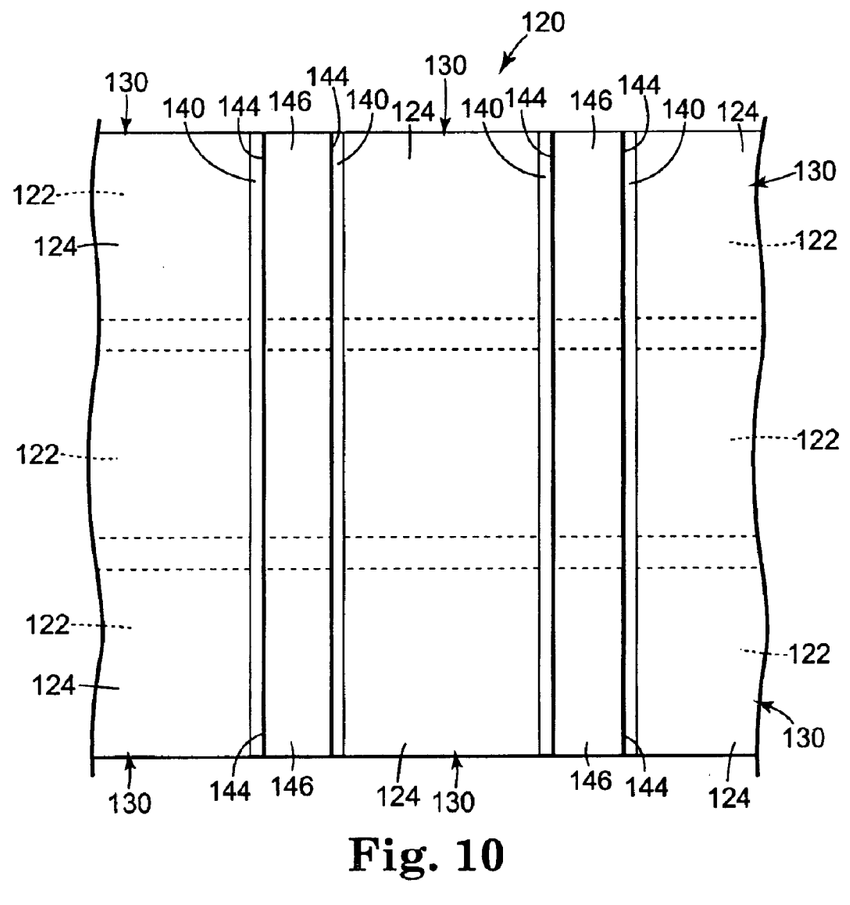
FIG. 10 is a top view of columns of bit cells taken along line 10—10 in FIG. 8 showing the magnetic flux absorbing material disposed adjacent to the columns of bit cells.

FIG. 10 is a top view of the columns of bit cells 130 as presented in FIG. 8. FIG. 10 illustrates columns of bit cells 130 positioned on word lines 122 showing coated dielectric layers 140 and 146 and magnetic flux absorbing layer 144 in relationship to bit cells 130 according to one embodiment of the present invention. The exposed write line 124 of bit cell 130 is configured to electrically communicate with subsequent layers of memory arrays 120 as the subsequent layers are constructed above write line 124. Adjacent to bit cells 130, and along the column of bit cells 130, is first dielectric layer 140. First dielectric layer 140 electrically insulates bit cells 130 from the subsequently deposited metallic layers. Adjacent to first dielectric 140 is magnetic flux absorbing layer 144, and second dielectric layer 146. FIG. 10 shows second dielectric layer 146 being exposed on top of word line 122. In this one embodiment according to the present invention, magnetic flux absorbing layer 144 is deposited between columns of bit cells to reduce the demagnetization field of the bit cells 130.

Figure 11:
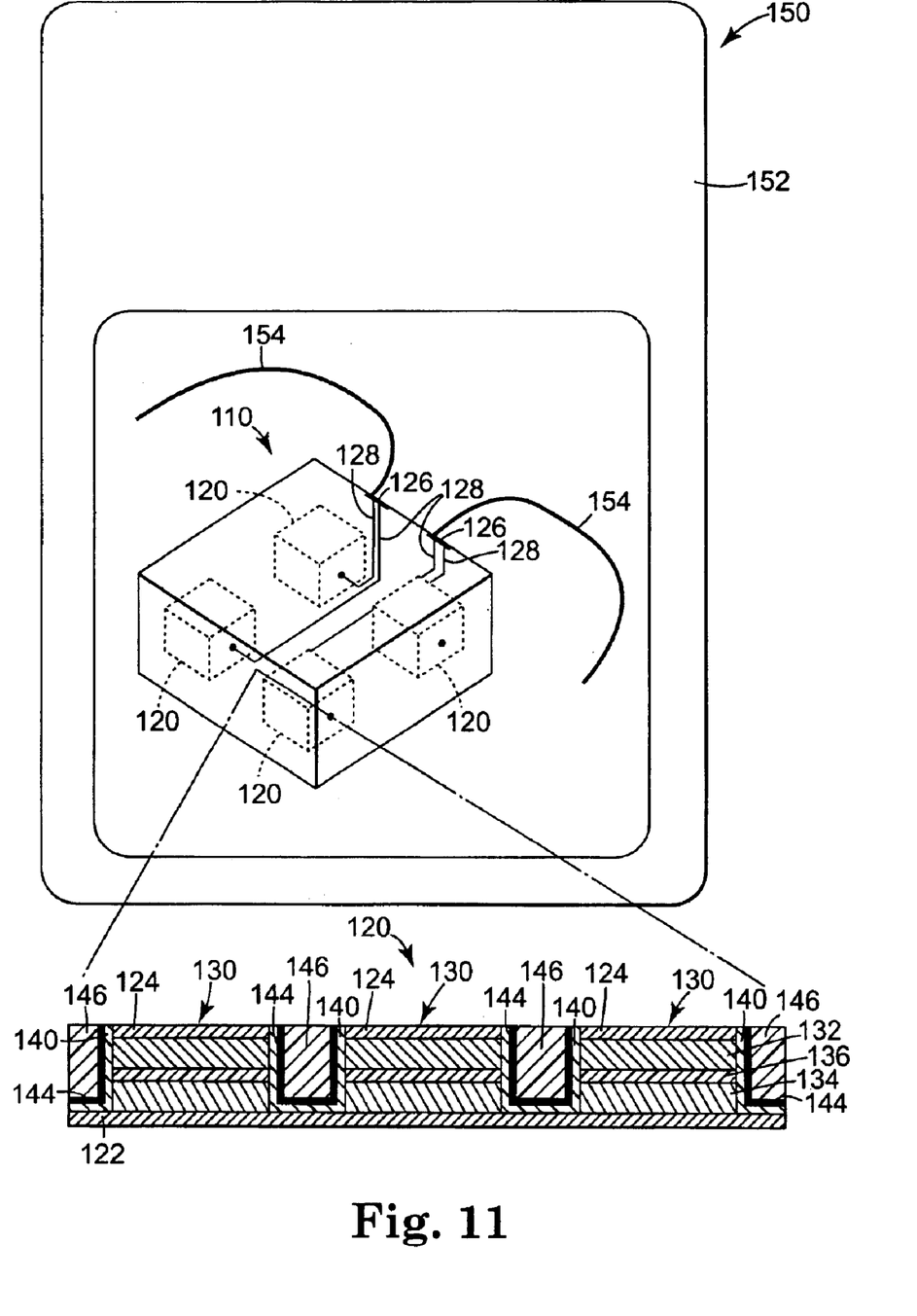
FIG. 11 is a perspective view of an electronic system including an electronic device and a memory chip provided with a memory array in accordance with another embodiment of the invention.

An electronic system including an electronic device and a memory chip provided with a memory array in accordance with the present invention is generally illustrated at 150 in FIG. 11. Electronic system 150 includes an electronic device 152 and a memory chip 110 (as in FIG. 2) separated from a memory wafer 100 (as in FIG. 1). Memory chip 110 includes a memory array 120 and bit cells 130, for example, such as memory array 120 and bit cells 130 as described in FIG. 8 above. Electrical conductors 154 emanate from electronic device 152 and are electrically connected to memory chip 110 at bond pads 126. In this manner, memory array 120 electrically communicates via communication lines 128 and electrical conductors 154 with electronic device 152 in defining electronic system 150. As illustrated in the exploded cross-sectional view of memory array 120 in FIG. 11, dielectric layers 140 and 146 and magnetic flux absorbing layer 144 have been removed from write lines 124. A magnetic flux absorbing layer 144 is disposed between at least two of the bit cells 130. Upon reading and appreciating this disclosure, it will be recognized that magnetic flux absorbing layer 144 could be deposited over an electrically non-conductive, non-magnetic layer 140 (as illustrated in FIGS. 8 and 11); alternately, magnetic flux absorbing layer 144 could be an electrically insulating, i.e., electrically non-conducting, soft magnetic layer deposited directly onto bit cells 130 (as in FIG. 9). In any regard, FIG. 11 illustrates in a manner intended in no way to be limiting, an electronic system 150 utilizing a memory chip 110 including a memory array 120 and a plurality of bit cells 130 and a magnetic flux absorbing layer 144 disposed between at least two bit cells 130.

What is claimed is:

1. A magnetic memory array comprising:
   a plurality of bit cells, each bit cell including at least one magnetic layer having free magnetic poles with a corresponding demagnetization field; and
   a magnetic flux absorbing layer having an isotropic response to magnetic fields disposed between at least two of the plurality of bit cells.

2. The magnetic memory array of claim 1, wherein the plurality of bit cells are oriented in rows and columns.

3. The magnetic memory array of claim 2, wherein the magnetic flux absorbing layer is disposed between at least one of the rows and the columns of the bit cells.

4. The magnetic memory array of claim 1, wherein the magnetic flux absorbing layer is disposed between all of the plurality of bit cells.

5. The magnetic memory array of claim 1, wherein the magnetic flux absorbing layer is substantially coplanar with the plurality of bit cells.

6. The magnetic memory array of claim 1, wherein the magnetic memory array is a magnetic random access memory array.

7. The magnetic memory array of claim 1, wherein the magnetic flux absorbing layer is contiguous with a non-magnetic layer.

8. The magnetic memory array of claim 1, wherein the magnetic flux absorbing layer is selected from the group consisting of iron, nickel, cobalt, alloys of iron, alloys of nickel, and alloys of cobalt.

9. The magnetic memory array of claim 1, wherein the magnetic flux absorbing layer is electrically insulating.

10. The magnetic memory array of claim 9, wherein the electrically insulating magnetic flux absorbing layer is a ferrite.

11. The magnetic memory array of claim 1, wherein the magnetic flux absorbing layer has a magnetic permeability of greater than 100.

12. The magnetic memory array of claim 1, wherein the magnetic flux absorbing layer has a coercivity of less than 10 Oersteds.

13. The magnetic memory array of claim 1, wherein the magnetic flux absorbing layer is an amorphous metal.

14. The magnetic memory array of claim 1, wherein the bit cells are spin tunneling bit cells.

15. A method of reducing demagnetization fields in a memory device having a plurality of magnetic bit cells, the method comprising:

depositing a magnetic flux absorbing layer having an isotropic response to magnetic fields at least between two bit cells of the plurality of bit cells.

16. The method of reducing demagnetization fields in a memory device of claim 15, wherein depositing the magnetic flux absorbing layer comprises depositing an electrically insulating magnetic flux absorbing layer.

17. The method of reducing demagnetization fields in a memory device of claim 15, wherein depositing the magnetic flux absorbing layer comprises depositing material selected from the group consisting of iron, nickel, cobalt, alloys of iron, alloys of nickel, and alloys of cobalt.

18. The method of reducing demagnetization fields in a memory device of claim 15, further comprising depositing a non-magnetic layer at least between two of the bit cells.

19. A memory chip separated from a memory wafer and configured for use in an electronic device, the memory chip comprising:

at least one memory array having a plurality of bit cells, each bit cell including at least one magnetic layer having free magnetic poles and a corresponding demagnetization field; and magnetic flux absorbing means having an isotropic response to magnetic fields between adjacent bit cells.

20. The memory chip of claim 19, wherein the magnetic flux absorbing means between adjacent bit cells is a coating deposited between adjacent bit cells, the coating comprising at least one non-magnetic layer contiguous with at least one magnetic flux absorbing layer.

21. The memory chip of claim 19, wherein the magnetic flux absorbing means between adjacent bit cells is an electrically insulating soft magnetic material.

22. An electronic system comprising:

an electronic device; and a memory chip electrically connected to the electronic device, the memory chip including a memory array;

wherein the memory array includes a plurality of bit cells and a magnetic flux absorbing layer having an isotropic response to magnetic fields disposed between at least two of the plurality of bit cells.

* * * * *